United States Patent [19]
Aketagawa et al.

[11] Patent Number: 5,661,547
[45] Date of Patent: Aug. 26, 1997

[54] EXPOSURE METHOD AND APPARATUS AND DEVICE PRODUCED THEREBY IN WHICH A STOP INCLUDES AN OPENING WHICH IS VARIABLE TO SUBSTANTIALLY COMPENSATE FOR A CHANGE IN BANDWIDTH OF A LASER BEAM

[75] Inventors: Masato Aketagawa, Kawasaki; Naoto Sano, Kunitachi, both of Japan

[73] Assignee: Canon Kabushiki Kaisha, Tokyo, Japan

[21] Appl. No.: 444,929

[22] Filed: May 19, 1995

Related U.S. Application Data

[62] Division of Ser. No. 430,158, Apr. 27, 1995, which is a continuation of Ser. No. 92,568, Jul. 16, 1993, abandoned, which is a continuation of Ser. No. 666,127, Mar. 7, 1991, abandoned.

[30] Foreign Application Priority Data

Mar. 9, 1990 [JP] Japan ................................ 2-059614
Mar. 5, 1991 [JP] Japan ................................ 3-064002

[51] Int. Cl.$^6$ ................................................ G03B 27/42
[52] U.S. Cl. ..................................... 355/53; 355/71
[58] Field of Search ................................ 355/53, 71

[56] References Cited

U.S. PATENT DOCUMENTS

| | | | |
|---|---|---|---|
| 4,711,568 | 12/1987 | Torigoe et al. | 355/68 |
| 4,773,750 | 9/1988 | Bruning | 353/122 |
| 4,811,055 | 3/1989 | Hirose | 355/53 |
| 4,853,756 | 8/1989 | Matsuki et al. | 355/53 X |
| 4,905,041 | 2/1990 | Aketagawa | 355/53 |
| 4,937,619 | 6/1990 | Fukuda et al. | 355/53 |
| 4,968,868 | 11/1990 | Aketagawa | 219/121.68 |
| 4,974,919 | 12/1990 | Muraki et al. | 360/6.6 |
| 5,089,913 | 2/1992 | Singh et al. | 359/727 |
| 5,121,160 | 6/1992 | Sano et al. | 355/53 |
| 5,386,269 | 1/1995 | Kosugi | 335/53 X |

FOREIGN PATENT DOCUMENTS

| | | |
|---|---|---|
| 60-162218 | 8/1985 | Japan . |
| 61-180434 | 8/1986 | Japan . |
| 2153543 | 8/1985 | United Kingdom . |

*Primary Examiner*—Fred L. Braun
*Attorney, Agent, or Firm*—Fitzpatrick, Cella, Harper & Scinto

[57] ABSTRACT

An exposure apparatus includes a supplying device for supplying a band-narrowed laser beam, an optical system for directing the laser beam to a substrate, a detecting device for detecting a change in bandwidth of the laser beam and a stop provided on a path of the laser beam, the stop including an opening having a size which is variable to substantially compensate for the change in bandwidth of the laser beam. Also, a device is manufactured by a method of exposing a photosensitive layer of a substrate through an optical system with a band-narrowed laser beam to print a circuit pattern on the photosensitive layer, in which a bandwidth of the laser beam is substantially compensated for, upon detecting a change in bandwidth of the laser beam, by adjusting a size of an opening of a stop provided in a path of the laser beam.

9 Claims, 4 Drawing Sheets

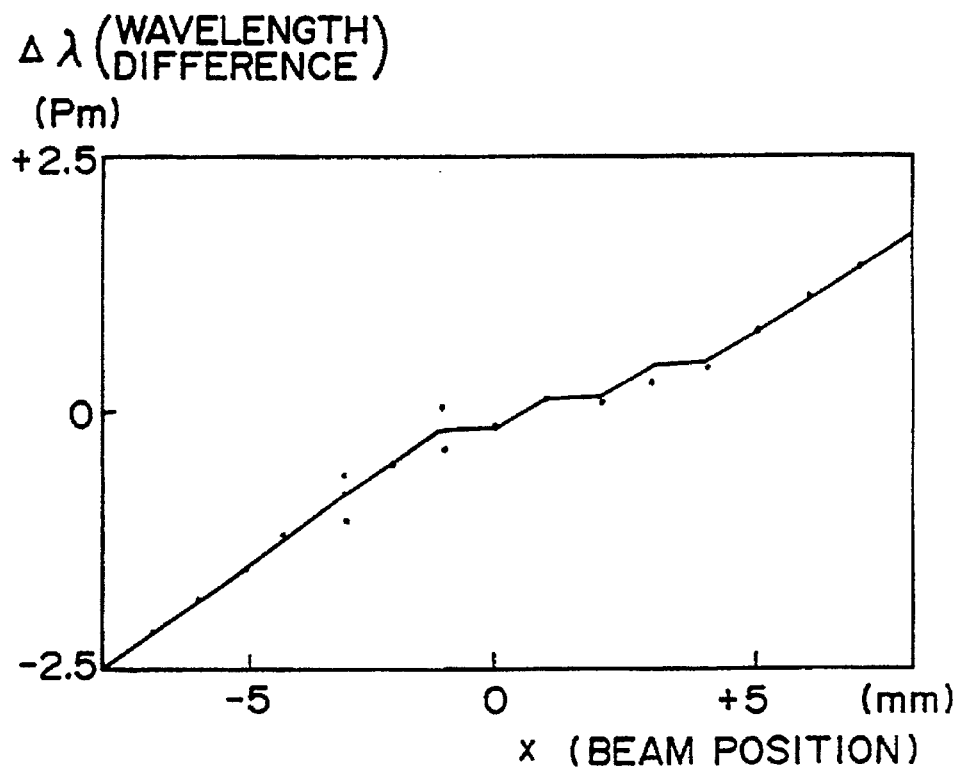
F I G. 5
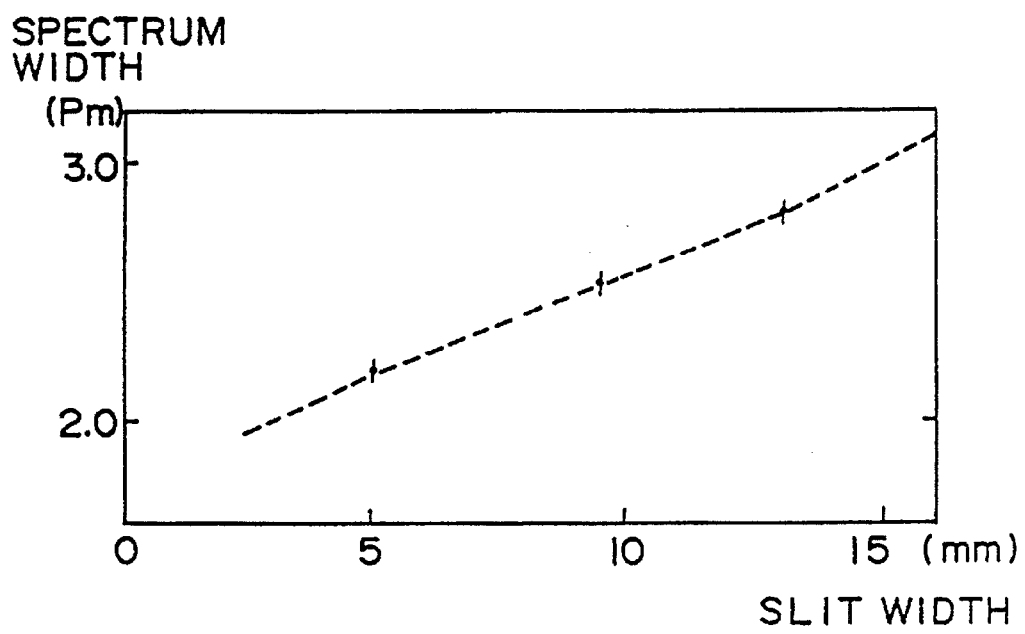
F I G. 6

EXPOSURE METHOD AND APPARATUS AND DEVICE PRODUCED THEREBY IN WHICH A STOP INCLUDES AN OPENING WHICH IS VARIABLE TO SUBSTANTIALLY COMPENSATE FOR A CHANGE IN BANDWIDTH OF A LASER BEAM

This application is a divisional of application Ser. No. 08/430,158 filed Apr. 27, 1995, which is a continuation of prior application, Ser. No. 08/092,568 filed Jul. 16, 1993, abandoned, which application is a continuation of prior application, Ser. No. 07/666,127 filed Mar. 7, 1991, now abandoned.

FIELD OF THE INVENTION AND RELATED ART

This invention relates to an exposure method and apparatus. More particularly, the invention is concerned with an exposure method and apparatus suitably usable for manufacture of semiconductor devices through exposure using a laser beam of narrowed bandwidth.

In order to meet the recent requirement of a further increase in the degree of integration of semiconductor device, a circuit pattern of a linewidth of about 0.5 micron has to be transferred onto a wafer. As an exposure apparatus that enables transfer of such a very fine circuit pattern, there is a projection exposure apparatus that uses a reduction projection lens system and a laser beam of a KrF excimer laser of a wavelength 248.4 nm, for projecting an image of a circuit pattern of a reticle upon a wafer.

Such a projection exposure apparatus is disclosed in British Patent No. 2,153,543 and U.S. Pat. Nos. 4,811,055, 4,711,568, 4,905,041, 4,974,919, 4,968,868 and 4,773,750.

The aforementioned U.S. Pat. No. 4,773,750 shows a projection exposure apparatus wherein the bandwidth of a laser beam from an excimer laser is narrowed to about 0.005 nm, in order to suppress chromatic aberration to be produced by a projection lens system. Generally, such bandwidth narrowing may be effected by providing an etalon, a prism, a diffraction grating or the like in a resonator of the FIG. 1 shows an example of an excimer laser wherein a prism and a diffraction grating are provided in a resonator. Denoted in the drawing at 1 is a laser; at 2 is a reflection type relief grating disposed at an end of a beam path in the resonator; at 3 is a prism having a function for expanding the beam diameter; at 4 and 4' are stops each having an aperture; at 5 and 5' are windows of a discharging chamber 6; at 7 is one of a pair of discharging electrodes disposed opposed to each other in a direction perpendicular to the sheet of the drawing; at 8 is an output mirror; and at A is a laser light emanating from the output mirror 8.

When an electric voltage is applied to the discharging electrodes 7 in the discharging chamber 6, an excimer gas contained in the discharging chamber 6 is excited and, from the resonator formed between the output mirror 8 and the grating 2, a band-narrowed laser light is emitted. Here, the spectral width of the laser light influenced by the grating 2 can be analyzed as follows:

If the pitch of lines of the grating 2 extending perpendicularly to the sheet of the drawing is denoted by d, the angle of incidence of the light upon the grating 2 is denoted by $\theta_B$ and the order of reflective diffraction at the grating 2 is denoted by m, then the wavelength $\lambda$ to be selected by the grating 2 can be given by the following equation:

$$\lambda = (2d/m) \sin \theta_B \quad (1)$$

Since the light incident on the grating 2 has an expansion of an angle $\Delta\theta_B$, from equation (1), the spectral width $\Delta\lambda_B$ of the light reflectively diffracted by the grating 2 back to the prism 3 is expressed as follows:

$$\Delta\lambda_B = (2d/m) \cos \theta_B \cdot \Delta\theta_B \quad (2)$$

Here, if light having no expansion such as a plane wave is inputted to the grating 2, the spectral width $\Delta\lambda_K$ of the light coming back to the prism 3 can be expressed as follows:

$$\Delta\lambda_K = (d/mD) \quad (3)$$

wherein D is the width of a region, to be illuminated, in a direction perpendicular to the grating line of the grating 2. Generally, there is a relationship of $\Delta\lambda_K < \Delta\lambda_B$.

An excimer laser or a laser having a similar resonator structure, has an expansion of spectrum as represented by equation (1). For this reason, irrespective of the fact that a band-narrowing element such as an etalon, a prism, a diffraction grating or the like is provided in the resonator, there is a tendency of relatively expanding bandwidth (halfwidth: FWHM) of a laser light emanating therefrom. If the intensity distribution of the laser light in the resonator changes due to deterioration, for example, of an electrode in the resonator, there arises a problem that the bandwidth changes and expands in accordance with such a change. This leads to non-stableness of a projection exposure apparatus having such a laser, since in some cases it is not possible to obtain a sufficient bandwidth necessary for suppressing chromatic aberration of a projection lens system or, in some cases, a change in the bandwidth of the laser light causes chromatic aberration in the projection lens system.

SUMMARY OF THE INVENTION

It is accordingly a primary object of the present invention to provide an improved exposure method and apparatus.

In accordance with a first aspect of the present invention, there is provided a method of exposing a substrate with a band-narrowed laser beam, wherein the laser beam is restricted to substantially compensate for a change in the bandwidth of the laser beam.

In accordance with a second aspect of the present invention, there is provided a method of exposing a substrate with a band-narrowed laser beam, wherein, when the bandwidth of the laser beam becomes greater than 0.005 nm, the laser beam is restricted to assure a bandwidth not greater than 0.005 nm, preferably not greater than 0.003 nm.

In accordance with a third aspect of the present invention, there is provided a method of exposing a photosensitive substrate with a band-narrowed laser beam from an excimer laser, comprising: providing a stop having an opening on a path of the laser beam; adjusting a size of the opening of the stop to substantially compensate for a change in bandwidth of the laser beam; and exposing after the adjustment the substrate with the laser beam.

In accordance with a fourth aspect of the present invention, there is provided a method of manufacture of semiconductor devices by exposing a photosensitive layer of a wafer to a band-narrowed laser beam from an excimer laser to print a circuit pattern on the photosensitive layer, said method comprising: providing a stop having an opening, on a path of the laser beam; adjusting a size of the opening to substantially compensate for a change in bandwidth of the laser beam; and exposing after the adjustment the wafer with the laser beam to print the circuit pattern on the wafer.

In accordance with a fifth aspect of the present invention, there is provided a projection exposure apparatus, comprising: an excimer laser arranged to provide a band-narrowed laser beam; a reticle stage for supporting a reticle; a wafer stage for supporting a wafer; an illumination system disposed between said laser and said reticle stage, for illuminating the reticle with the laser beam, said illumination system having a stop member with an opening, for restricting the laser beam, and an optical arrangement for expanding a diameter of the laser beam passed through said opening and for providing a substantially uniform intensity distribution in the laser beam; a projection lens system disposed between said reticle stage and said wafer stage, for projecting an image of a circuit pattern of the reticle on the wafer; an adjusting mechanism for adjusting a size of said opening of said stop member; and a detector for detecting a change in sectional intensity distribution of the laser beam; wherein said adjusting mechanism is operable to adjust the size of said opening of said stop member in response to detection of the change in intensity distribution by said detector, to substantially compensate for a change in bandwidth of the laser beam.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 5 is a graph, illustrating wavelength spectrum in a section of a laser light.

FIG. 6 is a graph, illustrating dependence of the bandwidth of a laser light upon the slit opening width.

DESCRIPTION OF THE PREFERRED EMBODIMENTS

Figure 1:
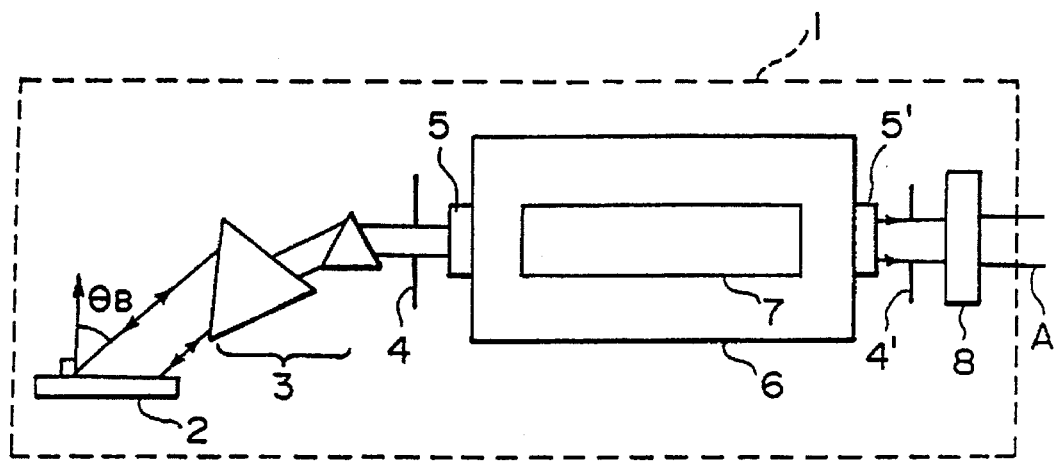
FIG. 1 is a schematic view, showing a general structure of a resonator of an excimer laser.
Figure 2:
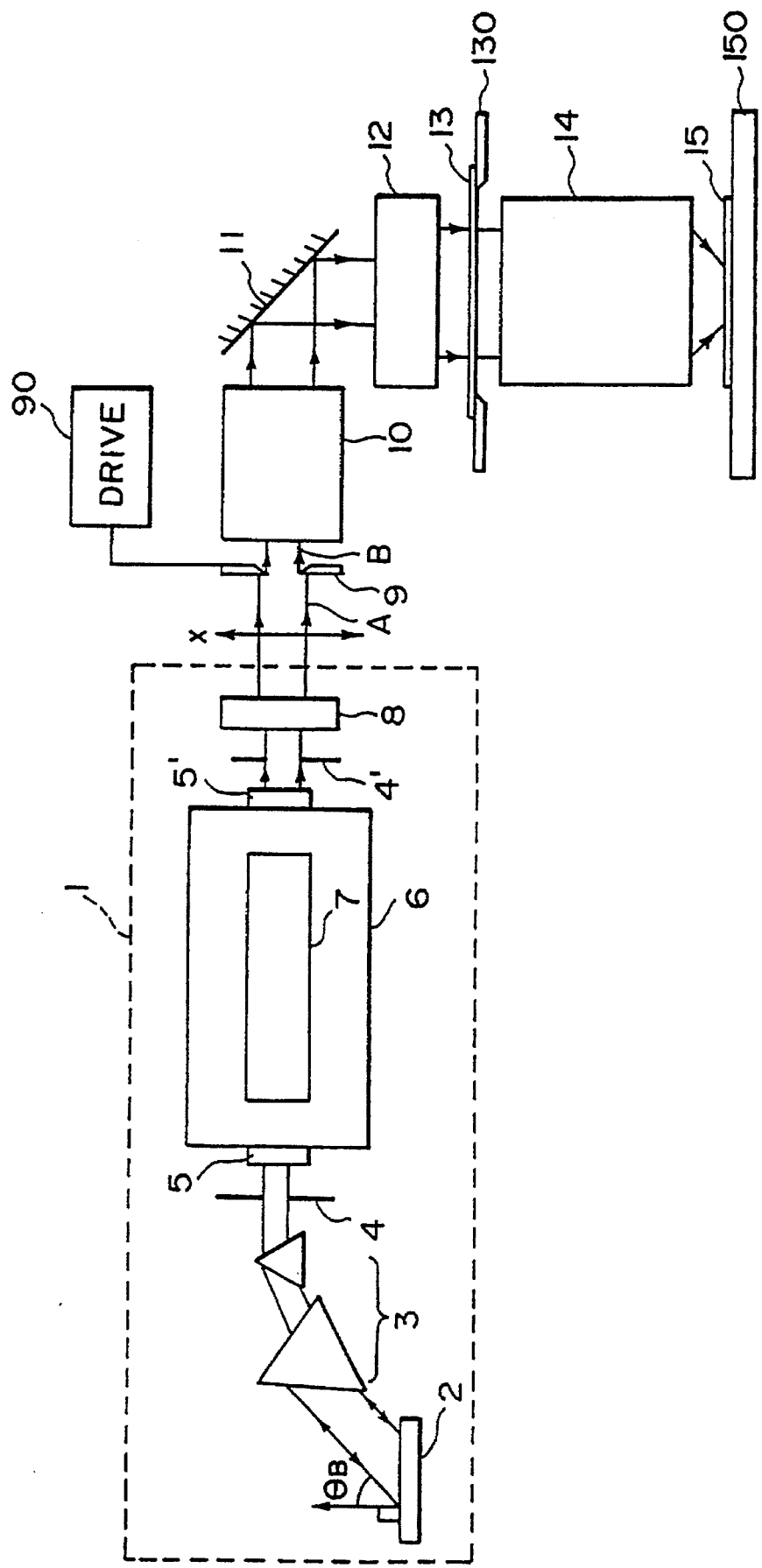
FIG. 2 is a schematic and diagrammatic view, showing a first embodiment of the present invention.

FIG. 2 is a schematic view of a first embodiment of the present invention. Denoted in the drawing at 1 is a KrF excimer laser; at 2 is a reflection type relief grating; at 3 is a prism having a function for expanding the beam diameter so as to illuminate the grating 2 with uniform illuminance; at 4 and 4' are stops each having an aperture; at 5 and 5' are windows of a discharging chamber 6; at 7 are discharging electrodes; and at 8 is an output mirror, all of which are similar to those shown in FIG. 1. Reference character A in FIG. 2 denotes laser light from the output mirror 8, having a center wavelength 248.4 nm and a bandwidth (halfwidth) greater than 0.005 nm. Reference character B denotes laser light having a narrowed bandwidth not greater than 0.003 nm.

Figure 3A:
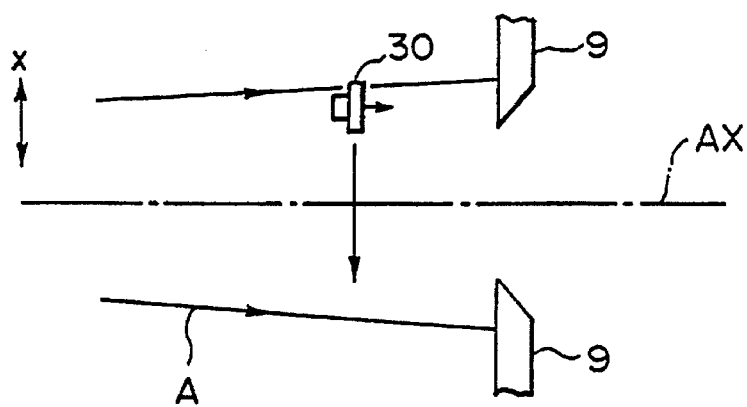
FIG. 3A is a schematic view, showing an example of a detector for monitoring a wavelength distribution of laser light A.
Figure 3B:
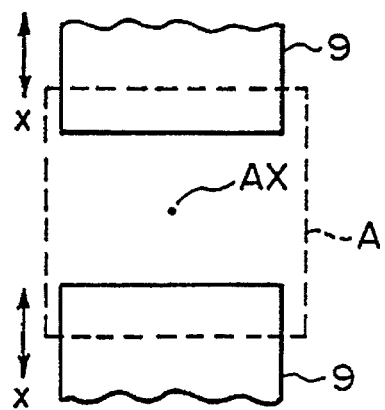
FIG. 3B is a front view, schematically showing the relationship between the laser light A and a slit 9.

Denoted at 9 is a slit member having a variable-width aperture, changeable in the X-axis direction as illustrated; at 10 is an introduction optical system for introducing light into a major part of a semiconductor exposure apparatus; at 11 is a total reflection mirror; at 12 is an illumination optical system; at 13 is a reticle; at 14 is a projection lens system; at 15 is a wafer; at 90 is a driver for actuating the slit 9; at 130 is a reticle stage; and at 150 is a wafer stage. The lengthwise direction of the aperture of the slit 9 is parallel to the direction of lines (grating lines) of the grating 2 and, thus, it is perpendicular to the sheet of the drawing. The aperture width of the slit 9 is changeable in the X-axis direction (widthwise direction), perpendicular to the lengthwise direction, by moving light blocking plates of the slit member through the actuator 90 to change the spacing of the light blocking plates. Namely, the aperture width can be adjusted by the driving mechanism 90. Each light blocking plate of slit 9 is made of a metal such as stainless steel or aluminum, for example. FIG. 3A is an enlarged side view of the slit 9, and FIG. 3B is an enlarged front view thereof. Reference character AX in FIG. 3A or 3B denotes the optical axis of the illumination system (10, 11 and 12). The broken line with reference character A in FIG. 3B depicts the sectional shape of the laser beam from the output mirror 8 which is rectangular. The widthwise direction of the rectangular shape coincides with the X direction (vertical) in this example as illustrated, and the lengthwise direction thereof coincides with a direction (horizontal) perpendicular to the X direction.

Excimer gas sealingly contained in the discharging chamber 6 is excited in response to application of a high voltage to the opposed discharging electrodes 7. The output mirror 8 cooperates with the grating 2 so as to provide a resonator therebetween and, as a result, a band-narrowed excimer laser light A can be emitted from the output mirror 8. The band-narrowed laser light A produced from the excimer laser 1 goes through the variable-width slit 9. Here, under the influence of the variable-width slit 9 as a stop, the spectral bandwidth of the laser light A can be further narrowed without increasing the spatial coherency of the laser light. Thus, an improved laser light B can be inputted into the introduction optical system 10. The laser light passing through the introduction optical system is shaped and expanded by this optical system 10 and, after being reflected by the total reflection mirror 11, it is inputted to the illumination optical system 12. In this illumination optical system 12, the laser light is transformed into light of uniform sectional intensity distribution in a known manner, such as disclosed in U.S. Pat. NO. 4,974,191, and the transformed light impinges on the reticle 13. The projection lens system 14 projects an image of a circuit pattern of the reticle 13, illuminated with such illumination light, upon the wafer 15 surface in a reduced scale. In this manner, a resist of the wafer 15 is exposed to the circuit pattern image, whereby a circuit pattern is printed on the wafer in a reduced scale.

Here, the function of the variable-width slit 9, namely, the influence thereof for narrowing the spectral bandwidth of the laser light without increasing the spatial coherency thereof, will be explained in detail. As discussed with reference to equation (1), the wavelength with a reflection angle $\theta_B$ of the grating 2 can be expressed by:

$$\lambda = (2d/m) \sin \theta_B$$

In FIG. 2, in the sectional plane of the laser light A just after being emitted from the output mirror 8, X axis is laid on the direction (X direction) perpendicular to the direction of lines of the grating 2. On the other hand, it is assumed that, when a light ray is reflected in the resonator by the grating 2 at an angle $\theta_B$ (=$\theta_0$), the position of this light ray in the laser light A on that beam section is taken as an origin for the X axis (i.e., coordinate x=0). If the angle $\theta_B$ changes from $\theta_0$ to $\theta_0+\Delta\theta$, then the coordinate x changes from 0 to $\Delta x$. Here, $\Delta x$ and $\Delta\theta$ can be approximated as $\Delta x = k \cdot \Delta\theta$, wherein k is a proportional constant. If $\Delta\theta \ll 1$, then a change $\Delta\lambda$ in wavelength can be approximated as follows:

$$\begin{aligned}\Delta\lambda &= (2d/m)\sin\theta \quad (4)\\ &= (2d/m)\sin(\Delta x/k)\\ &\approx \text{const.}\,\Delta x\end{aligned}$$

FIG. 5 shows a change in wavelength of a laser light emanating from an output mirror of a resonator on an occasion when a grating and a prism are used as the band narrowing means, with respect to a direction corresponding to an axis perpendicular to the grating line and crossing the path of the laser light. It is seen in the drawing that within the beam the wavelength changes linearly, reflecting the dispersion by the grating. Here, if the beam center is at a position x=0, for example, and the position x=0 is taken as a reference, a shift $\Delta\lambda$ of wavelength is greater with an increase in the absolute value of the coordinate x. From this, it is seen that, by disposing a slit 9 with a width variable in the X direction (corresponding to the widthwise direction of the beam section which is perpendicular to the grating line of the grating) after an output mirror 8, as in the present embodiment, to thereby restrict the width of the laser light A in the X direction, it is possible to suppress the spectrum of laser light A to a value near that at x=0 and, therefore, it is possible to obtain a laser light B of very narrowed bandwidth. Since the variable-width slit 9 is provided outside the resonator of the laser 1, it does not strengthen relatively weak spatial coherency which is an inherent property of the laser 1.

FIG. 6 shows the results when a band-narrowed laser light from a KrF excimer laser is restricted by a slit with a varying aperture width, and illustrates the relationship between the aperture width (mm) of the slit and the bandwidth (halfwidth (pm: picometer)) of the laser light passed through the aperture. As seen in FIG. 6, the aperture diameter of the stop and the bandwidth (halfwidth) of the laser light are in a substantially linear relationship.

The graphs of FIGS. 5 and 6 were prepared on the basis of results of measurement made at a distance 2 m from the emission end of a KrF excimer laser.

The present embodiment uses such a linear relationship between the aperture diameter of the stop and the bandwidth (halfwidth) of the laser light, and the width of the aperture of the slit 9 is changed so as to provide an adjusted bandwidth (halfwidth) of laser light B. As a result, even if the bandwidth of the laser light A changes and expands with time due to deterioration of the electrode 6 of the laser 1, for example, by detecting such change in the bandwidth and by narrowing the aperture width of the slit 9 through an appropriate quantity, it is possible to supply laser light B of a predetermined and desired bandwidth, constantly. In this embodiment, the projection lens system 14 is provided by a lens assembly made of a glass material of synthetic quartz. In order to suppress chromatic aberration of the projection lens system 14, in this embodiment the width of the slit 9 is adjusted so that the bandwidth of the laser light B does not become greater than 0.003 mm. It is to be noted here that, since an appropriate bandwidth of laser light is determined in dependence upon the linewidth of a circuit pattern or the type of lens assembly used, the bandwidth of the laser light B is not limited to a value not greater than 0.003 nm. Satisfactory results may be obtained with a bandwidth of about 0.005 nm or smaller.

A photodetector for detecting the bandwidth of the laser light A may comprise any one of various types of photodetectors. In this embodiment, a detector such as shown in FIG. 3A is used to detect the bandwidth. In FIG. 3A, reference numeral 30 denotes a photodetector such as a PSD or the like. The photodetector 30 may be moved so as to traverse the path of the laser light A, such that while scanning the photodetector 30 with the laser light A, the output of the photodetector 30 is monitored. In this manner, the intensity distribution of the laser light A in its widthwise direction (X direction) in section can be detected. From the obtained intensity distribution and the inherent spatial wavelength distribution (FIG. 5) of the laser 1, the wavelength spectrum of the laser light A can be determined and, from the wavelength spectrum, the bandwidth (halfwidth) can be detected.

On an occasion when only the expansion of the bandwidth of the laser light A is to be detected, only a change in the intensity distribution of the laser light A from its initial state (which may be measured beforehand), may be detected. Thus, as an alternative, a glass plate or the like may be inserted across the path of the laser light A, and a change in the intensity distribution can be detected by observing the illuminance distribution upon the glass plate.

In place of scanning the photodetector 30 with the laser light A, a one-dimensional or two-dimensional photoelectric converting element array may be inserted across the path of the laser light, so as to detect the intensity distribution of the laser light A.

The aperture width of the slit 9 may be adjusted by moving the slit 9 manually or automatically, in accordance with the result of monitoring of the intensity distribution of the laser light A. When this is to be done automatically, the photodetector 30 may be communicated with a controller of the exposure apparatus through a signal line, so that an output signal from the photodetector may be processed by the controller to determine the bandwidth and the quantity of movement of the slit 9 by the driver 90 may be controlled accordingly.

Since the restriction of the laser light A by the slit 9 is necessary when the bandwidth of the laser light A is not narrowed as desired, it is possible to use such structure that the slit 9 is selectively inserted across the path of the laser light A. As an example, the slit 9 may be mounted demountably.

The slit of this embodiment comprises two movable light blocking plates, but four light blocking plates may be used to define the aperture. In that case, two or all the four light blocking plates may be made movable. As a further alternative, a single light blocking plate having apertures of different diameters may be used, which light blocking plate may be moved so as to align an appropriate one of the apertures with the path of the laser light, when desired.

In this embodiment, the laser light is restricted by the variable slit 9 disposed outside the resonator of the laser 1 to accomplish narrowing of the bandwidth. However, such a variable slit may be provided within the resonator of the laser 1.

Figure 4:
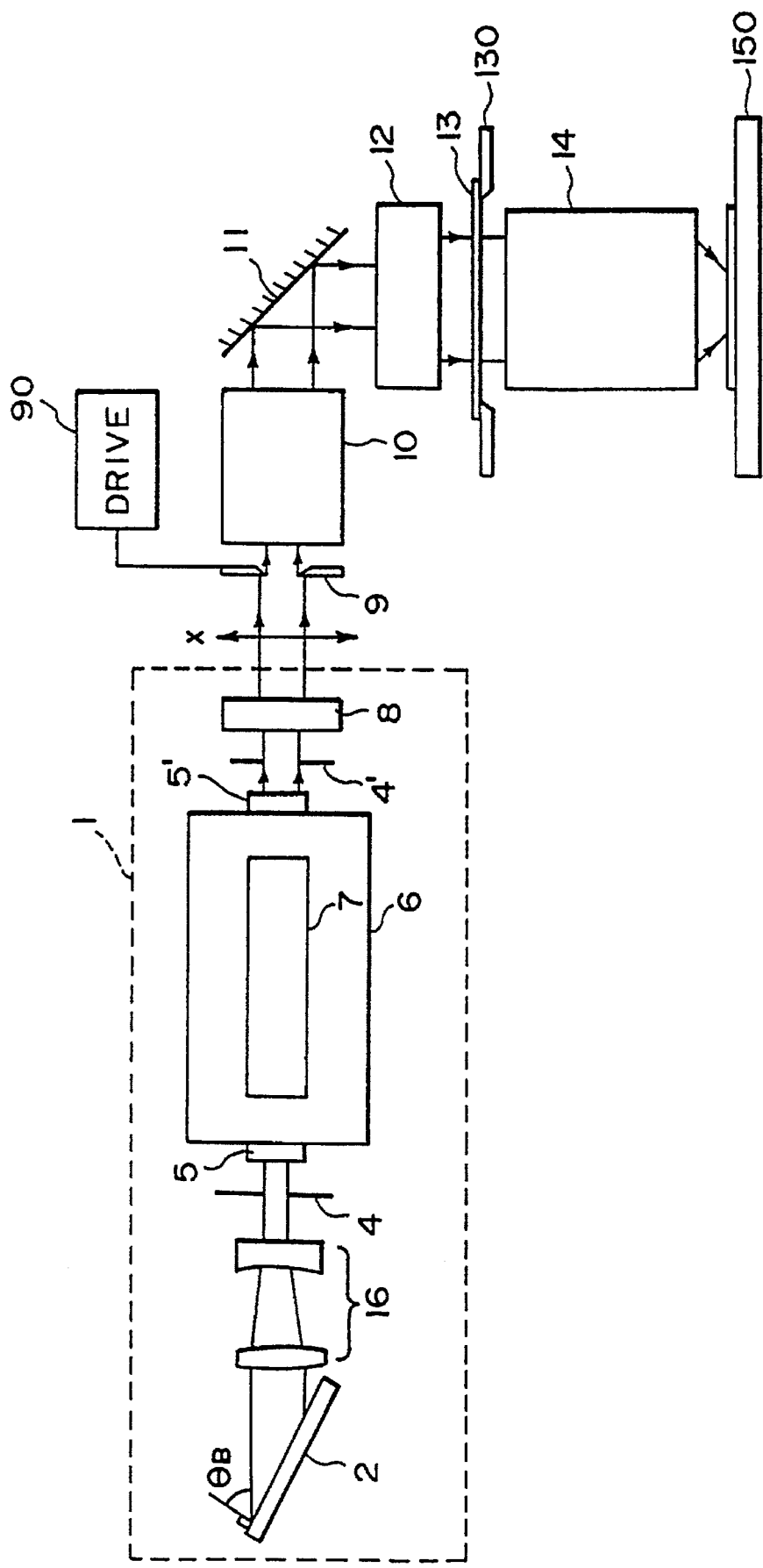
FIG. 4 is a schematic and diagrammatic view, showing a second embodiment of the present invention.

FIG. 4 is a schematic view of a major part of a second embodiment of the present invention. Like numerals as of FIG. 1 are assigned to corresponding elements. The exposure apparatus of this embodiment is equipped with an intensity distribution monitor such as shown in FIG. 3A.

Denoted in the drawing at 1 is a resonator of a KrF excimer laser (light source); at 2 is a grating which serves as a dispersing element for band narrowing; at 4 and 4' are aperture stops in the resonator; at 5 and 5' are windows of a discharging chamber 6; at 7 are opposed discharging electrodes; and at 8 is an output mirror. Outside the resonator 1 of the laser 1, there are a variable-width slit 9 having an aperture variable in the x direction (FIG. 3B), an introduction optical system 10 for introducing light into a major part of the semiconductor exposure apparatus, a total reflection mirror 11, an illumination optical system 12, a reticle 13 for manufacture of semiconductor devices, a projection lens system 14 and a wafer 15.

One feature of the FIG. 4 structure resides in use of a cylindrical expander 16 as an optical system in the resonator for uniformly illuminating the grating 2. With this structure, all the components other than the grating 2, which is disposed obliquely, can be disposed perpendicularly on the optical axis of the laser. Therefore, the disposition of the device is simple. The cylindrical expander 16 is provided by a cylindrical lens having its generating line disposed coincident with the direction of lines of the grating 2.

The operation of this embodiment is similar to that shown in FIG. 2. That is, an excimer gas sealingly contained in the discharging chamber 6 is excited in response to an application of a high voltage to the opposed discharging electrodes 7 and, as a result, band-narrowed excimer laser light is emitted from the output mirror 8. The laser light A produced by the KrF excimer laser 1 goes through the aperture of the variable-width slit 9. Here, under the influence of the variable-width slit 9, the spectral bandwidth is further narrowed without enlarging the spatial coherency, whereby laser light B is inputted to the introduction optical system 10. The laser light passing through the introduction optical system 10, the mirror 11 and the illumination optical system 12, impinges on the reticle 13, such that the wafer 15 is exposed to an image of the circuit pattern of the reticle 13 by means of the projection lens system 14.

In the preceding embodiments, the variable-width slit 9 is disposed between the band-narrowed excimer laser 1 and the introduction optical system 10. However, the position of the variable-width slit 9 is not limited thereto. If in an optical system after the introduction optical system 10 there is a position which is optically conjugate with the position shown in FIG. 2 or 3, the variable-width slit 9 may be disposed at such position, with substantially the same effect as that of the preceding embodiment. Such a position may be on the path of light before it impinges on the reticle 13. Examples are a position within the introduction optical system 10, a position between the introduction optical system 10 and the illumination optical system 12 and a position within the illumination optical system 12. In any case, the lengthwise direction of the variable-width slit 9 is placed parallel to the direction of the grating lines, when taken at the grating 2 position, and expansion control is made to the laser light A from the laser 1, with respect to the X direction of an angle of 90 degrees to the direction of the grating line, as in the preceding embodiment. The aperture width of the slit 9 may be held fixed during a certain period and may be changed as required to adjust the bandwidth of the laser light B. Preferably, the slit may be disposed at such portion of the path at which the laser light is substantially parallel.

By means of a slit (stop) provided outside the resonator of the laser, the bandwidth of laser light can be effectively narrowed without increasing the spatial coherency of the laser light itself. Accordingly, in a semiconductor exposure method and apparatus using a band-narrowed laser as a light source, since the spatial coherency is not strengthened, on one hand it is possible to suppress unwanted interference such as speckle or the like. On the other hand, as an advantageous result of narrowed spectral bandwidth, it is possible to reduce the effect of chromatic aberration of the projection lens system and, thus, to enhance the resolution. Consequently, semiconductor devices of good quality can be manufactured stably.

While the foregoing embodiments have been explained with reference to an exposure apparatus having a KrF excimer laser as a light source, a different type excimer laser using a different excimer gas or a different type laser may be used as the light source. Further, the projection lens system is not limited to a single-material lens assembly, and as an example a lens assembly made of different glass materials such as synthetic quartz and fluorite ($CaF_2$) may be used.

The present invention is not limited to an exposure apparatus of projection type. As an example, the present invention is applicable to an apparatus wherein deep ultraviolet laser light is focused on a workpiece such as a wafer by means of a lens assembly to draw a pattern thereon by the laser light. In that case, like the foregoing embodiments, the lens assembly may be made of a single glass material containing synthetic quartz as a major component. Such advantageous effects result from application of the present invention to a laser for producing laser light of a wavelength not greater than 300 nm, with respect to which a usable glass material is very limited.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:
   supplying means for supplying a band-narrowed laser beam;
   an optical system for directing the laser beam to a substrate;
   detecting means for detecting a change in bandwidth of the laser beam; and
   stop means provided on a path of the laser beam, said stop means including an opening having a size which is variable to substantially compensate for the change in bandwidth of the laser beam.

2. An apparatus according to claim 1, wherein said supplying means comprises a resonator and wherein said stop means is provided in the resonator.

3. An apparatus according to claim 1, wherein said stop means is provided in said optical system.

4. An apparatus according to claim 1, wherein said supplying means comprises an excimer laser.

5. An apparatus according to claim 1, wherein said supplying means comprises a resonator and a diffraction grating, including grating elements, disposed in the resonator for band-narrowing the laser beam, and wherein a direction of the size of the opening of said stop means corresponds to a direction of juxtaposition of the grating elements of the diffraction grating.

6. An apparatus according to claim 1, wherein said detecting means comprises measuring means for measuring a sectional light intensity distribution of the laser beam.

7. An apparatus according to claim 6, wherein said measuring means comprises a beam detector which is movable along the sectional light intensity distribution of the laser beam.

8. An apparatus according to claim 1, wherein said optical system comprises an illumination optical system for directing the laser beam to a mask, and a projection optical system for projecting a pattern of the mask onto the substrate, and further comprising means for optimizing said projection optical system with respect to a predetermined bandwidth.

9. A device manufactured by a method of exposing a photosensitive layer of a substrate through an optical system with a band-narrowed laser beam to print a circuit pattern on the photosensitive layer, said device manufactured by the steps of:

providing stop means, having an opening, in a path of the laser beam;

detecting a change in bandwidth of the laser beam;

adjusting a size of the opening of the stop means to substantially compensate for the change in bandwidth of the laser beam; and exposing, after the adjustment, the substrate with the bandwidth compensated laser beam to print the circuit pattern on the substrate.

* * * * *

UNITED STATES PATENT AND TRADEMARK OFFICE
CERTIFICATE OF CORRECTION

PATENT NO. : 5,661,547
DATED : August 26, 1997
INVENTOR(S) : MASATO AKETAGAWA, ET AL.

It is certified that error appears in the above-identified patent and that said Letters Patent is hereby corrected as shown below:

COLUMN 1

Line 24, "device," should read --devices,--.
Line 41, "of the" should read --of the laser.--.

COLUMN 4

Line 14, "slit 9" should read --the slit 9--.
Line 45, "NO" should read --No.--.
Line 61, "Just" should read --just--.

COLUMN 5

Line 3, "$\Delta x = \cdot \Delta \theta$," should read --$\Delta x = k \cdot \Delta \theta$,--.

UNITED STATES PATENT AND TRADEMARK OFFICE
CERTIFICATE OF CORRECTION

PATENT NO. : 5,661,547
DATED : August 26, 1997
INVENTOR(S) : MASATO AKETAGAWA, ET AL.

It is certified that error appears in the above-identified patent and that said Letters Patent is hereby corrected as shown below:

COLUMN 6

Line 57, "as of" should read --as in--.
Line 66, "resonator 1" should read --resonator--.

Signed and Sealed this

Fourteenth Day of April, 1998

Attest:

BRUCE LEHMAN

Attesting Officer          Commissioner of Patents and Trademarks